(12) United States Patent
Chen

(10) Patent No.: US 7,294,865 B2
(45) Date of Patent: Nov. 13, 2007

(54) LIGHT EMITTING DEVICE AND THE USE THEREOF

(75) Inventor: Cheng-Chuan Chen, Tainan Hsien (TW)

(73) Assignee: Genesis Photonics Inc., Tainan Hsien (TW)

( * ) Notice: Subject to any disclaimer, the term of this patent is extended or adjusted under 35 U.S.C. 154(b) by 196 days.

(21) Appl. No.: 11/190,980

(22) Filed: Jul. 28, 2005

(65) Prior Publication Data

US 2006/0131595 A1 Jun. 22, 2006

(30) Foreign Application Priority Data

Dec. 17, 2004 (TW) .............................. 93139372 A

(51) Int. Cl.
*H01L 33/00* (2006.01)

(52) U.S. Cl. .................... 257/98; 257/101; 257/89; 257/E33.061

(58) Field of Classification Search .................. 257/98
See application file for complete search history.

(56) References Cited

U.S. PATENT DOCUMENTS

| 6,730,943 | B2 | 5/2004 | Massies et al. | |
|---|---|---|---|---|
| 6,734,467 | B2* | 5/2004 | Schlereth et al. | 257/89 |
| 2005/0161690 | A1* | 7/2005 | Lai et al. | 257/98 |
| 2005/0227388 | A1* | 10/2005 | Setlur et al. | 438/22 |

FOREIGN PATENT DOCUMENTS

TW 508840 6/2001

\* cited by examiner

*Primary Examiner*—Tu-Tu Ho
(74) *Attorney, Agent, or Firm*—Foley & Lardner LLP

(57) ABSTRACT

A light emitting device includes a die and a photostimulable luminescent substance. The die has a first semiconductor light-emitting layer emitting a first color light having a first wavelength range, and a second semiconductor light-emitting layer emitting a second color light having a second wavelength range different from the first wavelength range. The photostimulable luminescent substance is excitable by at least one of the first and second color lights to emit a third color light having a third wavelength range. The third color light is mixed with the first and second color lights to emit a light blend having a wavelength range covering the first, second, and third wavelength ranges.

14 Claims, 9 Drawing Sheets

LIGHT EMITTING DEVICE AND THE USE THEREOF

CROSS-REFERENCE TO RELATED APPLICATION

This application claims priority of Taiwanese Application No. 093139372, filed on Dec. 17, 2004.

BACKGROUND OF THE INVENTION

1. Field of the Invention

The invention relates to a light emitting device, more particularly to a light emitting device applicable to a backlight module, a displayer, a luminescent device, and the like.

2. Description of the Related Art

A first type of a conventional LED assembly for emitting white light includes a first LED emitting red light, a second LED emitting green light, and a third LED emitting blue light. The LED assembly can emit white light by combining the red, green, and blue lights, and adjusting the ratio of the light intensities of the first, second, and third LEDs.

A second type of a conventional LED assembly for emitting white light includes a LED emitting blue light and a fluorescent material excitable by the blue light to emit a substantially yellow light. The substantially yellow light emitted by the fluorescent material is combined with the blue light from the LED to produce white light. For example, U.S. Pat. No. 5,998,925 discloses such a LED assembly.

However, in the first type of the conventional LED assembly, since three LEDs are required for each LED assembly, the size of each LED assembly is relatively large, and the production cost thereof is relatively high as well. As for the second type of the conventional LED assembly, since the intensities of the red and green light portions are insufficient, the color rendering index (CRI) of the second type of the conventional LED assembly is inferior. Furthermore, when the second type of the conventional LED assembly is used as a light source for a liquid crystal display, most of the yellow light portion cannot pass through a color filter, which merely permits red, blue, and green light to pass therethrough. Therefore, illumination intensity of the liquid crystal display is insufficient.

SUMMARY OF THE INVENTION

Therefore, it is an object of the present invention to provide a light emitting device which has a superior CRI, and which is applicable to a backlight module so as to reduce the size of the backlight module.

In the first aspect of this invention, a light emitting device includes a die and a photostimulable luminescent substance. The die has a first semiconductor light-emitting layer emitting a first color light having a first wavelength range, and a second semiconductor light-emitting layer emitting a second color light having a second wavelength range different from the first wavelength range. The photostimulable luminescent substance is excitable by at least one of the first and second color lights to emit a third color light having a third wavelength range. The third color light is mixed with the first and second color lights to emit a light blend having a wavelength range covering the first, second, and third wavelength ranges.

In the second aspect of this invention, a backlight module includes the light emitting device of this invention.

BRIEF DESCRIPTION OF THE DRAWINGS

Other features and advantages of the present invention will become apparent in the following detailed description of the preferred embodiments with reference to the accompanying drawings, of which.

DETAILED DESCRIPTION OF THE PREFERRED EMBODIMENTS

Figure 1:
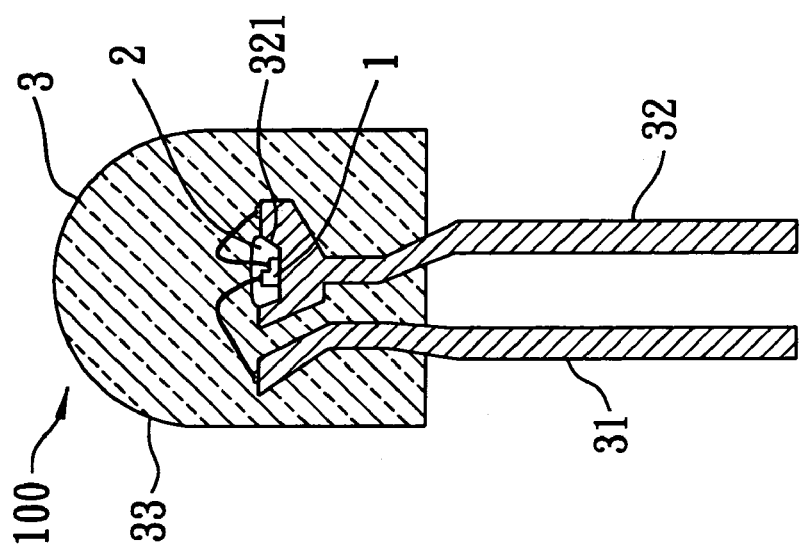
FIG. 1 is a schematic sectional view of the first preferred embodiment of a light emitting device according to this invention.

Before the present invention is described in greater detail, it should be noted that like elements are denoted by the same reference numerals throughout the disclosure.

Referring to FIG. 1, the first preferred embodiment of a light emitting device 100 according to this invention is shown to include a die 1, a photostimulable luminescent substance 2, and a holding member 3.

The holding member 3 holds the die 1 and the photostimulable luminescent substance 2, and includes a first lead 31 electrically connected to the die 1, and a second lead 32 electrically connected to the die 1 and having a receiving recess 321 at a top end thereof. The first and second leads 31, 32 are substantially parallel to each other. In the preferred embodiment, the first lead 31 is a p-type electrode lead, and the second lead 32 is an n-type electrode lead. The die 1 is received in the receiving recess 321 of the second lead 32. The photostimulable luminescent substance 2 is filled in the receiving recess 321 of the second lead 32 to encapsulate the die 1. The holding member 3 further includes a light-transmissive encapsulating material 33, which is a resin in this preferred embodiment, to encapsulate the die 1, the photostimulable luminescent substance 2, and upper portions of the first and second leads 31,32.

Figure 4:
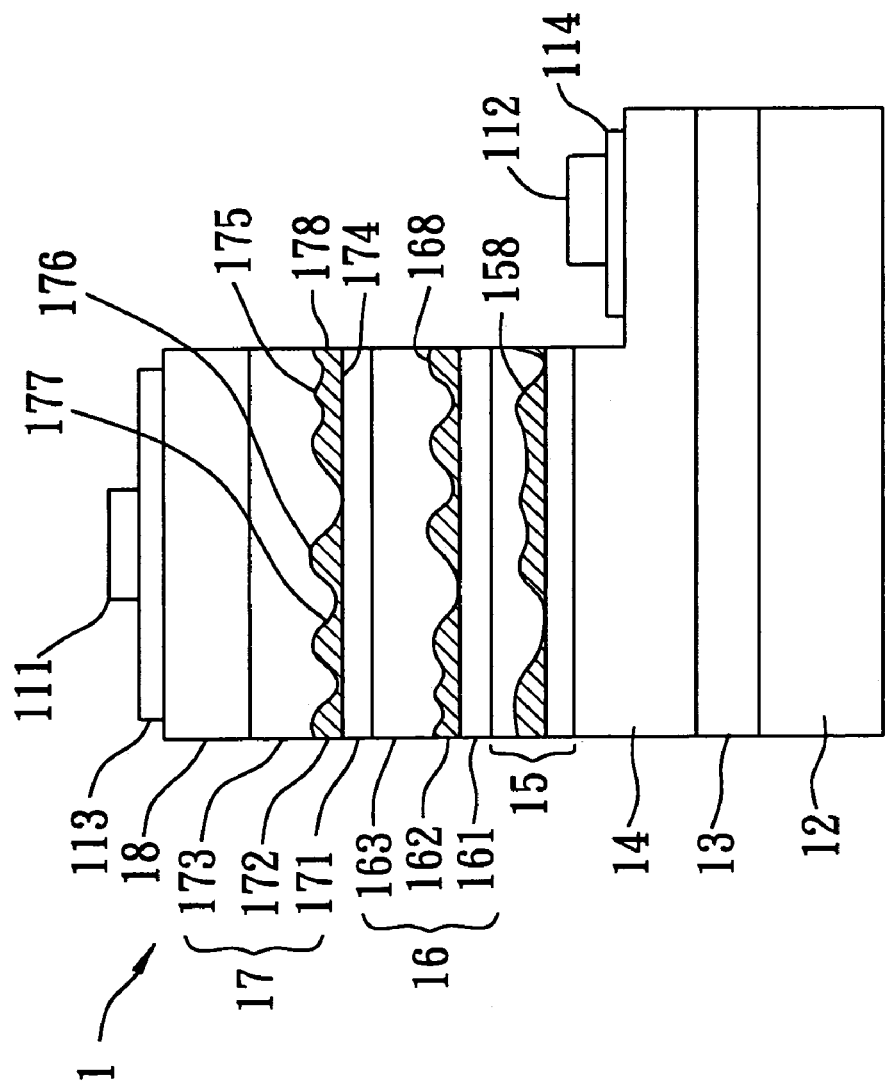
FIG. 4 is a schematic view of a die used in the first preferred embodiment.

Referring to FIG. 4, the die 1 includes a first semiconductor light-emitting layer 16 emitting a first color light having a first wavelength range, and a second semiconductor light-emitting layer 15 emitting a second color light having a second wavelength range different from the first wavelength range. In this preferred embodiment, the first color light is a blue light having the first wavelength range from 440 nm to 480 nm. The second color light is a green light having the second wavelength range from 520 nm to 560 nm. In addition to the first and second semiconductor light-emitting layers 16,15, the die 1 includes a substrate 12, a buffering layer 13 formed on the substrate 12, an n-type cladding layer 14 formed on the buffering layer 13 and interposed between the buffering layer 13 and the second semiconductor light-emitting layer 15, a third semiconductor light-emitting layer 17 formed on the second semiconductor light emitting layer 16, a p-type cladding layer 18 formed on the third semiconductor light-emitting layer 17, a p-side contact layer 113 formed on the p-type cladding layer 18, a p-type electrode 111 formed on the p-side contact layer 113 and electrically connected to the first lead 31 (i.e., the p-type electrode lead), an n-side contact layer 114 formed on the n-type cladding layer 14, and an n-type electrode 112 formed on the n-side contact layer 114 and electrically connected to the second lead 32 (i.e., the n-type electrode lead). In this preferred embodiment, the third semiconductor light-emitting layer 17 emits a UV light having a wavelength smaller than 440 nm.

Figure 2:
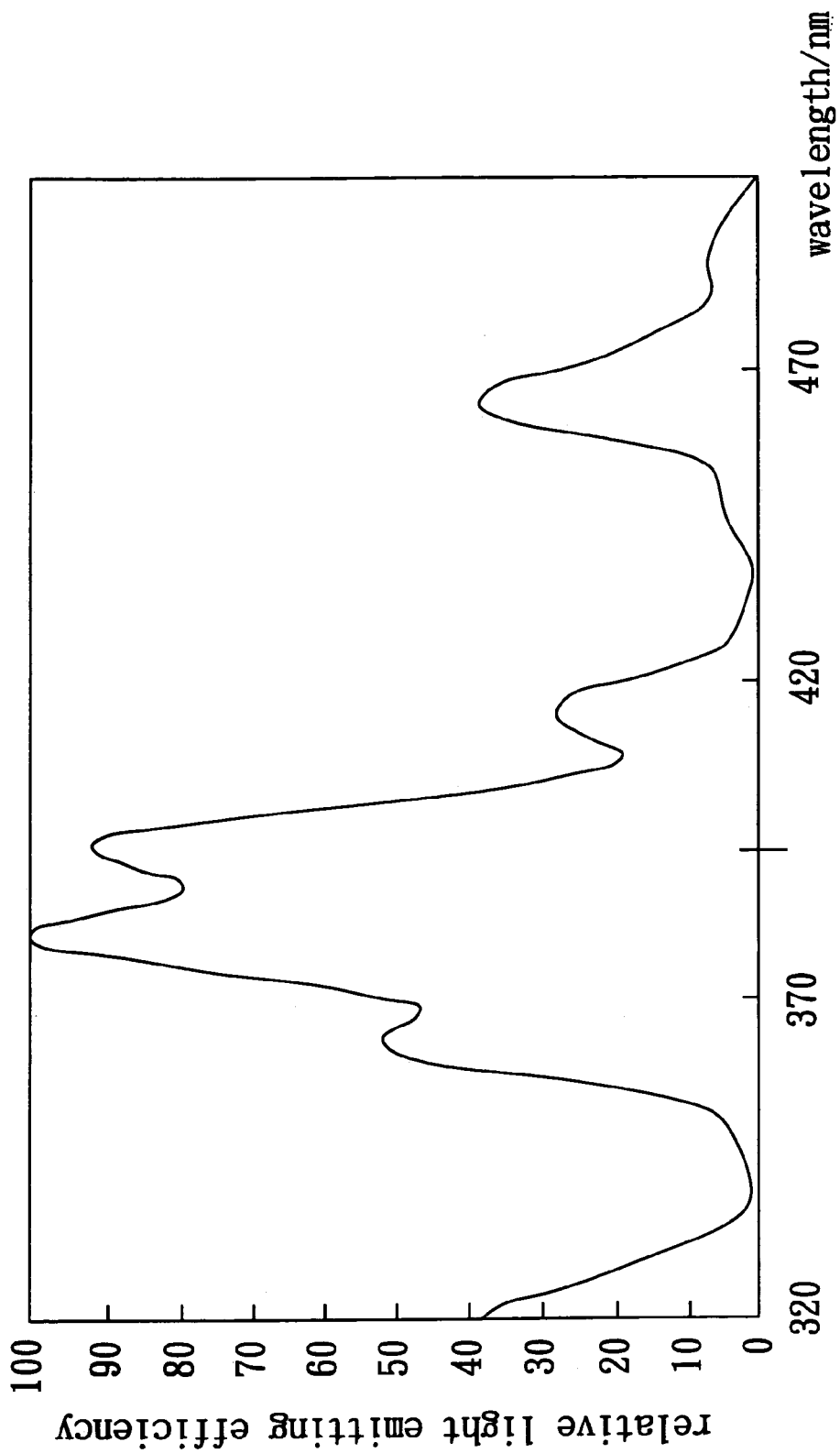
FIG. 2 illustrates absorption spectrum of a photostimulable material used in the first preferred embodiment.
Figure 3:
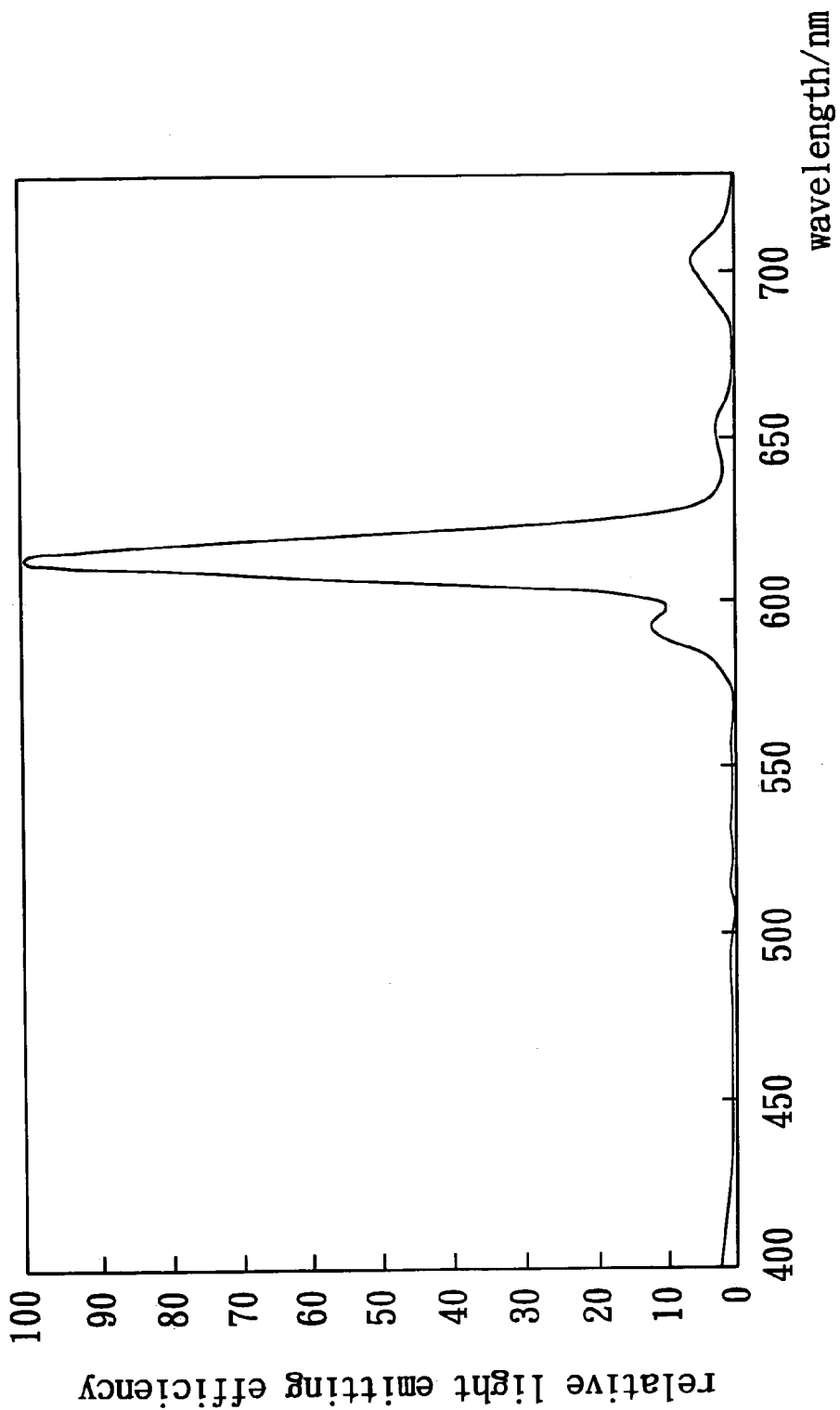
FIG. 3 illustrates emission spectrum of light emitted by the photostimulable material upon exciting the same.

The photostimulable luminescent substance 2 is excitable by at least one of the first color light, the second color light, and the UV light to emit a third color light having a third wavelength range. The third color light is mixed with the first and second color lights to emit a light blend having a wavelength range covering the first, second, and third wavelength ranges. Referring to FIGS. 2 and 3, in this preferred embodiment, the photostimulable luminescent substance 2 is made of $LiEuW_2O_8$, and is excitable by the first color light (i.e., blue light) and the UV light to emit a red light having the third wavelength range from 575 to 650 nm, which is mixed with the first and second color lights (i.e., blue and green light, respectively) to emit a white light blend. Other materials suitable for use as the photostimulable luminescent substance 2 includes $(Y,La)_2O_3:Eu$, $(Ba,Mg,Zn)S:Eu$, $Y_2O_2S:Eu$, $Y_2O_2S:Bi$, $YVO_4:Eu$, $YVO_4:Bi$, $SrY_2S_4:Eu$, $CaLaS_4:Ce$, $(Ba,Ca,Sr)S:Eu$, $SrS:Eu$, $(Zn,Cd)S:Ag$, $(Zn,Cd)S:Cl$, $AEu_xLn_{1-x}M_2O_8$, $Y_2O_3:Eu$, $Y_2O_3:Bi$, $QP_2O_7:Eu$, $QP_2O_7:Mn$, and $3.5MgO.0.5MgF_2.GeO_2:Mn$, wherein:

$0<x\leq1$;

A is Li, Na, K, Rb, or Cs;

Ln is Y, La, Gd, or Lu;

P is W or Mo; and

Q is Sr, Ca, Ba, or Mg.

Figure 5:
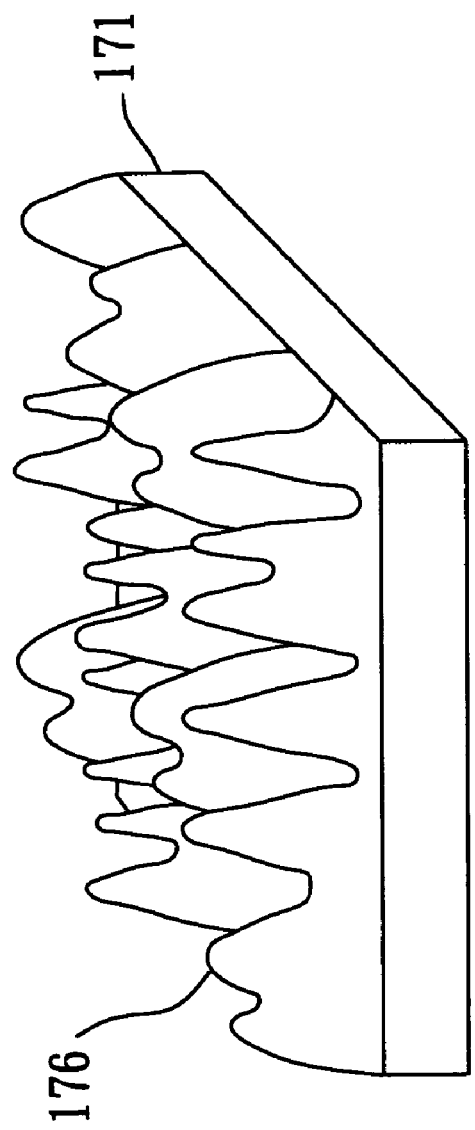
FIG. 5 is a perspective view of a semiconductor light-emitting layer used in the first preferred embodiment.
Figure 6:
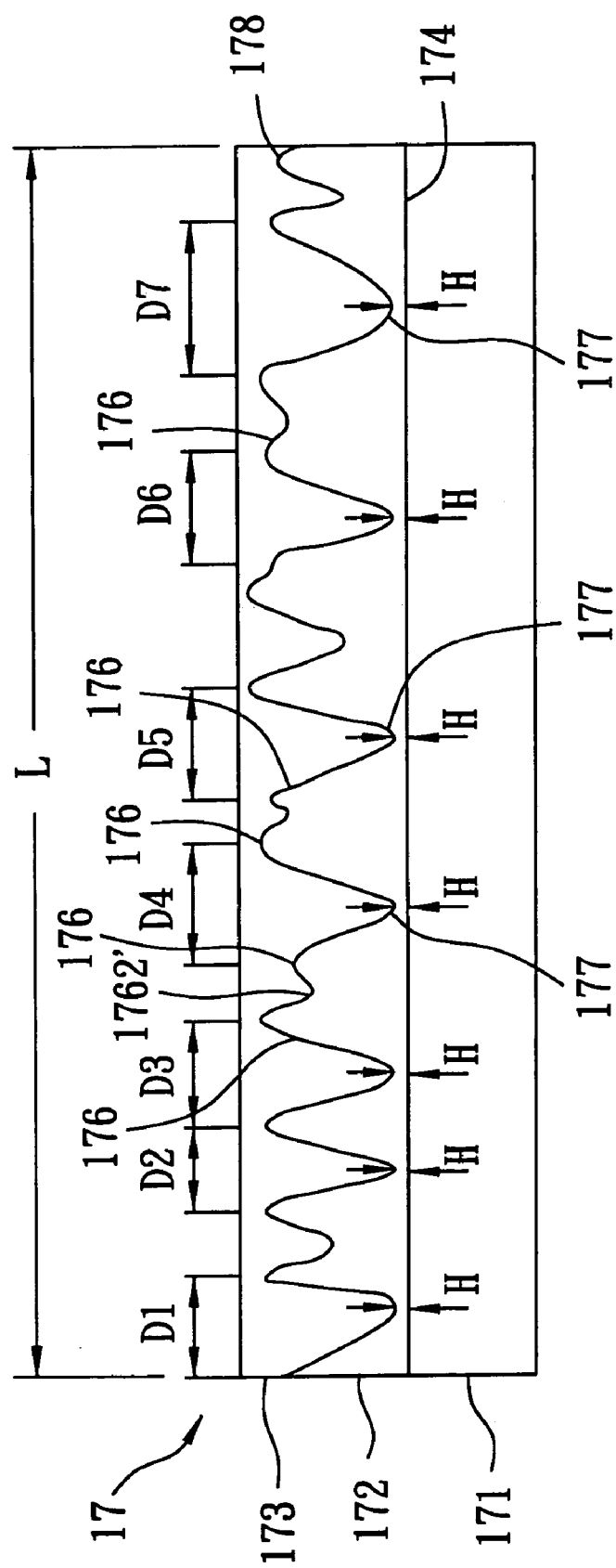
FIG. 6 is a schematic view of the semiconductor light-emitting layer.

Referring to FIGS. 4, 5, and 6, the third semiconductor light-emitting layer 17 includes a first barrier film 173 proximate to the p-type cladding layer 18, a second barrier film 171 proximate to the first semiconductor light-emitting layer 16, and a carrier confining film 172 between the first and second barrier films 173, 171. The carrier confining film 172 has a bottom surface 174 proximate to the second barrier film 171 and a top surface 175 proximate to the first barrier film 173, and is configured with a mountain shape profile 178 having a plurality of alternating peaks 176 and valleys 177.

Specifically referring to FIG. 6, in the mountain shape profile 178, each of the valleys 177 has a height (H) relative to the bottom surface 174 of the carrier confining film 172, and the height (H) ranges from 0 to 2 mm. Therefore, the recess portion 1762' does not meet the definition of the valley 177. A valley density is defined by a ratio of a summation of the widths (D1, D2, D3, D4, D5, D6, D7 . . . ) of the valleys 177 to a total length (L) of the third semiconductor light-emitting layer 17 along a direction that the widths (D1, D2, D3, D4, D5, D6, D7 . . . ) are measured. Preferably, the third semiconductor light-emitting layer 17 has a valley density ranging from 5% to 75%.

The carrier confining film 172 has an energy gap which should be smaller than those of the first and second barrier films 173, 171. In the preferred embodiment, the carrier confining film 172 is made of an indium-containing material having the formula $Al_{(1-x-y)}In_yGa_xN$, wherein $0\leq x<1$, $0<y\leq1$, and $0\leq 1-x-y<1$. The first and second barrier films 173, 171 are made of gallium nitride. The ratio of x and y can be adjusted so as to emit the UV light having a wavelength smaller than 440 nm. In the preferred embodiment, the UV light emitted by the third semiconductor light-emitting layer 17 is adjusted to be 395 nm. In addition, the intensity of the UV light can be adjusted by varying the valley density of the mountain shape profile 178. In the preferred embodiment, the valley density of the third semiconductor light-emitting layer 17 is 46%.

Similarly, referring again to FIG. 4, the first semiconductor light-emitting layer 16 includes a first barrier film 163 proximate to the second barrier film 171 of the third semiconductor light-emitting layer 17, a second barrier film 161 proximate to the second semiconductor light-emitting layer 15, and a carrier confining film 162 between the first and second barrier films 163, 161. The first color light emitted by the first semiconductor light-emitting layer 16 can be adjusted by varying the ratio of x and y in the formula of the material for the carrier confining film 162 so as to result in blue light having a wavelength ranging from 440 nm to 480 nm. In the preferred embodiment, the wavelength of the blue light is 465 nm. Moreover, the intensity of the blue light can be adjusted by varying the valley density of the mountain shape profile 168 of the carrier confining film 162. In the preferred embodiment, the valley density of the first semiconductor light-emitting layer 16 is 38%.

Similarly, in the preferred embodiment, the second semiconductor light-emitting layer 15 includes a mountain shape profile 158, and is designed to emit the green light having a wavelength of 538 nm. Alternatively, the mountain shape profile 158 of the second semiconductor light-emitting layer 15 can be replaced with a quantum well.

Furthermore, in the preferred embodiment, the substrate 12 is made of a light-transmissive sapphire. The buffering layer 13 is a laminate composed of a low-temperature-grown gallium nitride film, a high-temperature-grown silicon nitride film, and a high-temperature-grown gallium nitride film (not shown). The n-type cladding layer 14 is an n-type indium gallium nitride semiconductor layer. The p-type cladding layer 18 is a p-type indium gallium nitride semiconductor layer. The p-side contact layer 113 is a transparent indium tin oxide layer. The n-side contact layer 114 is an ohmic contact layer made of chromium.

As described above, in the preferred embodiment, the photostimulable luminescent substance 2 is excitable by the UV light emitted by the third semiconductor light-emitting layer 17 and the blue light emitted by the first semiconductor light-emitting layer 16 to emit the red light, which is mixed with the blue light and the green light emitted by the second semiconductor light-emitting layer 15 to emit the white light blend. Since the first, second, and third semiconductor light-emitting layers 16, 15, 17 can be adjusted to vary the blending ratio of the blue, green, and red lights, the white light having a superior color rendering index can be produced.

Notably, although three semiconductor light-emitting layers 15, 16, 17 are used in the preferred embodiment, the number of the semiconductor light-emitting layers can be varied according to specific requirements in an actual application with the proviso that the carrier confining film 172 of the third semiconductor light-emitting layer 17, which is proximate to the p-type cladding layer 18, should have the mountain shape profile 178. In addition, the wavelength of the light emitted by the respective one of the first, second, and third semiconductor light-emitting layers 16, 15, 17 can be varied according to specific requirements in an actual application. Therefore, the light blend can be a light other than the white light.

Figure 7:
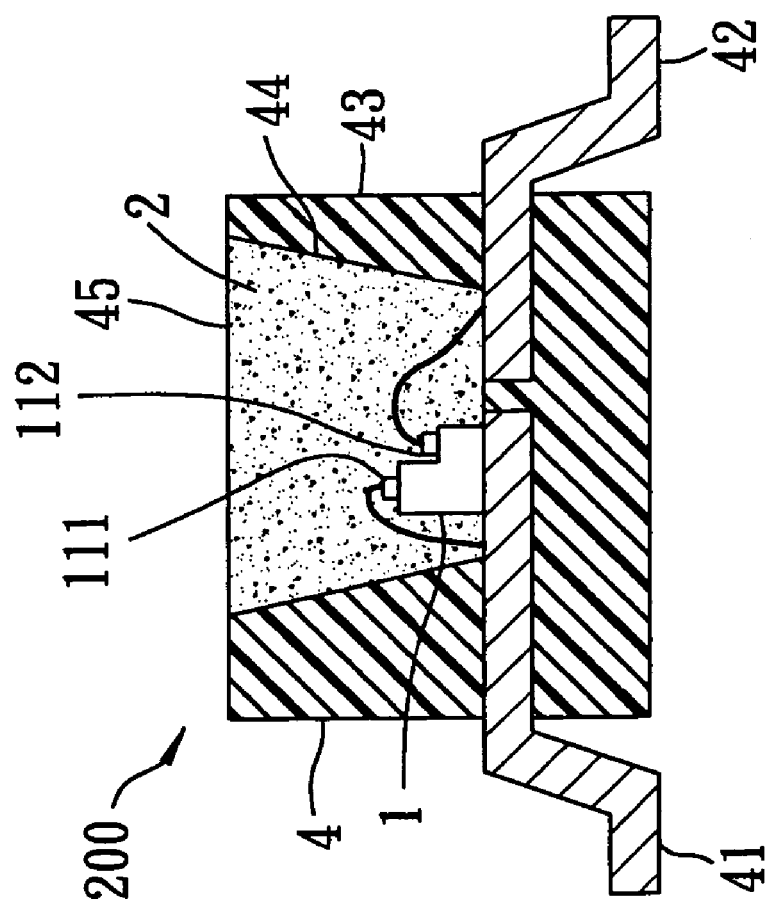
FIG. 7 is a schematic sectional view of the second preferred embodiment of a light emitting device according to this invention.

Referring to FIG. 7, the second preferred embodiment of the light emitting device 200 according to this invention is shown to include the die 1, the photostimulable luminescent substance 2, and the holding member 4. The die 1 and the photostimulable luminescent substance 2 of the second preferred embodiment are identical to the die 1 and the photostimulable luminescent substance 2 of the first preferred embodiment.

The holding member 4 includes a holding seat 43 having a receiving recess 44 for receiving the die 1 and the photostimulable luminescent substance 2, the first lead 41 (i.e., the p-type electrode lead) electrically connected to the p-type electrode 111 of the die 1, and a second lead 42 (an n-type electrode lead) electrically connected to the n-type electrode 112 of the die 35. Additionally, the holding member 4 includes a light-transmissive encapsulating body 45 to encapsulate the die 1. The photostimulable luminescent substance 2 is contained in the light-transmissive encapsulating body 45.

Figure 8:
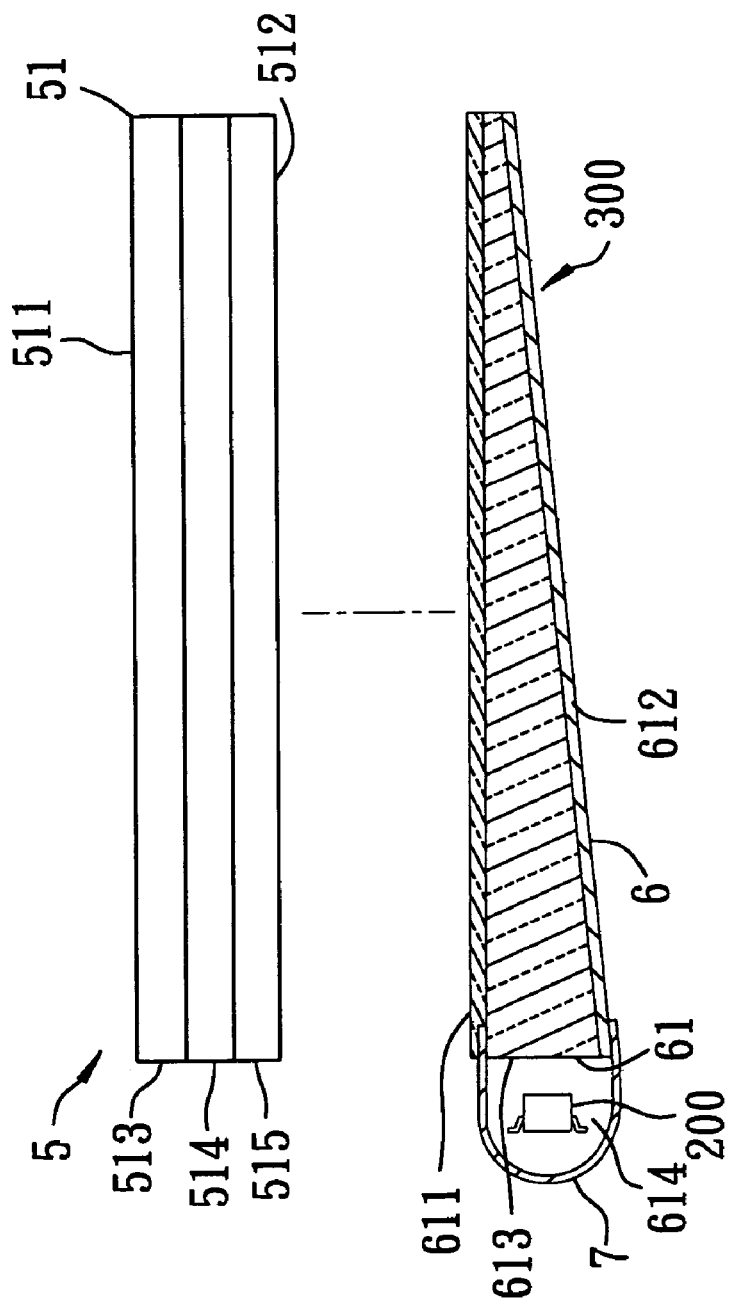
FIG. 8 is a schematic sectional view of a side-edge type backlight module incorporating the light emitting device of this invention.

Referring to FIG. 8, a liquid crystal displayer 5 is shown to include a liquid crystal module 51, and a side-edge type backlight module 300 mounted below the liquid crystal module 51 and incorporating the second preferred embodiment of the light emitting device 200 of this invention. The liquid crystal module 51 has a front side 511 and a rear side 512, and includes a color filter unit 513, a liquid crystal unit 514, and a glass substrate unit 515 along a direction from the front side 511 to the rear side 512.

The backlight module 300 is disposed on the rear side 512 of the liquid crystal module 51, and includes a light guide member 6, a reflective member 7 defining a receiving space 614, and a plurality of the light emitting devices 200 disposed in the receiving space 614. The light guide member 6 includes a light guide panel 61 having a top face 611 to be connected to the rear side 512 of the liquid crystal module 51, a bottom face 612 opposite to the top face 611 and inclined relative to the top face 611, and a side face 613 extending between the top and bottom faces 611, 612. The reflective member 7 is mounted proximate to the side face 613 of the light guide panel 61.

The light blend, which is white light in the preferred embodiment, emitted from the light emitting devices 200 is either transmitted directly into the light guide panel 61 through the side face 613 of the light guide panel 61, or is reflected by the reflective member 7 and is then transmitted into the light guide panel 61 through the side face 613 of the light guide panel 61. The white light transmitted into the light guide panel 61 is reflected by the bottom face 612 of the light guide panel 61, and is transmitted to the liquid crystal module 51 through the top face 611 of the light guide panel 61 and the rear side 512 of the liquid crystal module 51.

Figure 9:
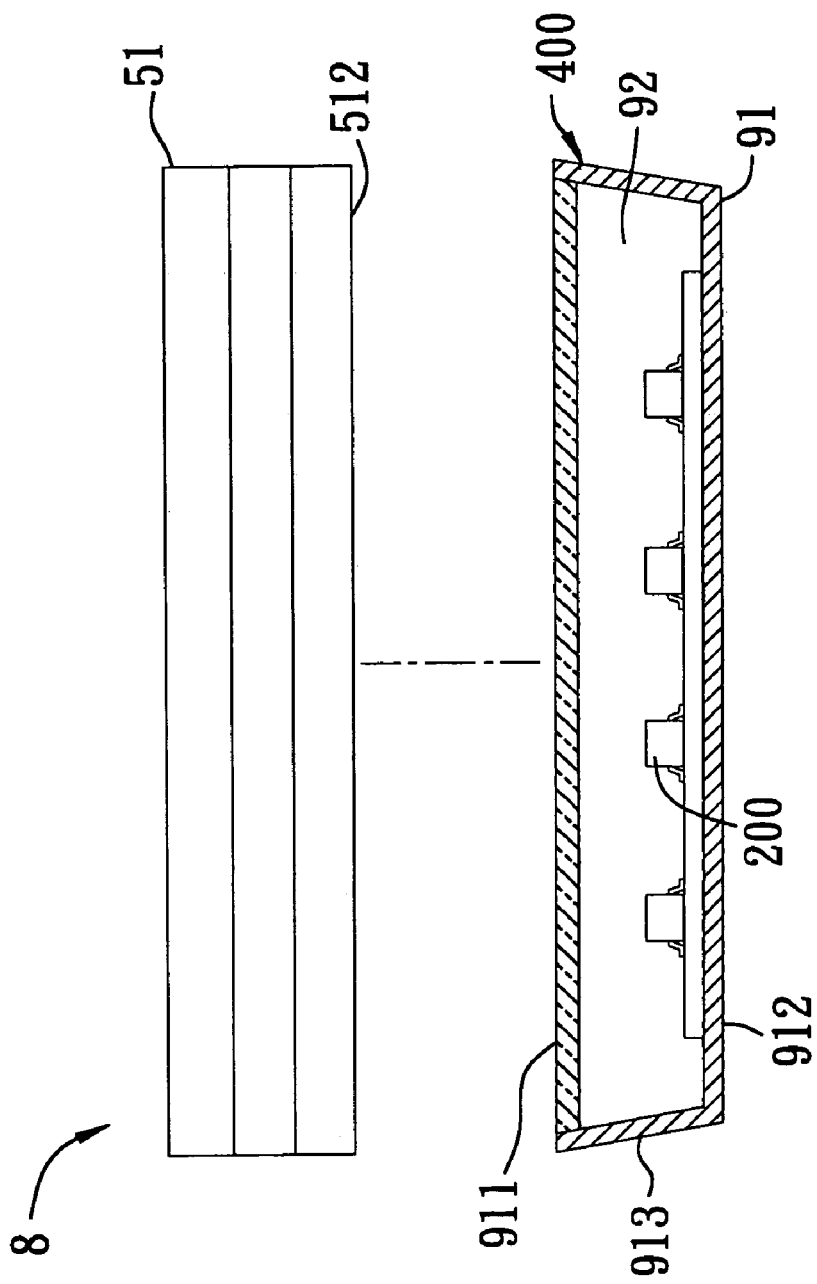
FIG. 9 is a schematic sectional view of a direct type backlight module incorporating the light emitting device of this invention.

Referring to FIG. 9, the preferred embodiment of the light emitting device 200 is shown to be installed in a direct type backlight module 400 of a liquid crystal displayer 8. The liquid crystal displayer 8 includes the liquid crystal module 51 identical to that used in the aforesaid liquid crystal displayer 5 of FIG. 8, and the direct type backlight module 400.

The backlight module 400 is mounted below the liquid crystal module 51. The backlight module 400 includes a housing 91 defining a receiving space 92, and a plurality of the light emitting device 200 mounted in the receiving space 92. The housing 91 is configured as a wedge shape, and has a top wall 911 proximate to the rear side 512 of the liquid crystal module 51, a bottom wall 912 opposite to the top wall 911, and a peripheral wall 913 extending between the top and bottom walls 911, 912 so as to define the receiving space 92. The top wall 911 of the housing 91 is light-transmissible.

The light blend, which is white light in the preferred embodiment, emitted from the light emitting devices 200 is transmitted directly to the liquid crystal module 51 through the top wall 911 of the housing 91 of the backlight module 400 and the rear side 512 of the liquid crystal module 51.

In view of the aforesaid, since the die 1 can emit the first and second color lights simultaneously, the size of the light emitting device 100, 200 can be reduced as compared to the conventional LED assembly which requires at least three LEDs. The thickness of the direct type backlight module 400, or the size of the reflective member 7 of the side-edge type backlight module 300, required for combining the light from the light emitting devices 100, 200 can be reduced. Therefore, the backlight module 300, 400 can be minimized in thickness. Furthermore, the die 1 can be adjusted in the valley density of the mountain shape profile, the ratio of x to y in the formula $Al_{(1-x-y)}In_yGa_xN$ of the indium-containing material for the carrier confining films 172, 162, and the number of the semiconductor light-emitting layers 15, 16, 17 to emit the first and second color lights having specific requirements in intensity and ratio that are combined with the third color light emitted by the photostimulable luminescent substance 2 to produce white light for the liquid crystal module 51. Moreover, the optical characteristics, such as color rendering index and the like, can be improved in this invention as compared to the second type of the conventional LED assembly described above.

While the present invention has been described in connection with what is considered the most practical and preferred embodiments, it is understood that this invention is not limited to the disclosed embodiments but is intended to cover various arrangements included within the spirit and scope of the broadest interpretation so as to encompass all such modifications and equivalent arrangements.

I claim:

1. A light emitting device, comprising:
a die including a first semiconductor light-emitting layer emitting a first color light having a first wavelength range, and a second semiconductor light-emitting layer emitting a second color light having a second wavelength range different from the first wavelength range; and
a photostimulable luminescent substance excitable by at least one of the first and second color lights to emit a third color light having a third wavelength range, the third color light being mixed with the first and second color lights to emit a light blend having a wavelength range covering the first, second, and third wavelength ranges,
wherein said die further includes a p-type cladding layer and an n-type cladding layer, said first and second semiconductor light-emitting layers being disposed between said p-type and n-type cladding layers, said first semiconductor light-emitting layer being proximate to said p-type cladding layer, and including a first barrier film proximate to said p-type cladding layer, a second barrier film, and a carrier confining film between said first and second barrier films and having a plurality of alternating peaks and valleys, said carrier confining film having an energy gap smaller than those of said first and second barrier films.

2. The light emitting device as claimed in claim 1, wherein the light blend produces white light.

3. The light emitting device as claimed in claim 1, wherein said carrier confining film is made of a material having a formula $Al_{(1-x-y)}In_yGa_xN$, wherein $0 \leq x < 1$, $0 < y \leq 1$, and $0 \leq 1-x-y < 1$.

4. The light emitting device as claimed in claim 1, wherein said first semiconductor light-emitting layer has a valley density ranging from 5% to 75%, the valley density being defined by a ratio of a summation of the widths of said valleys to a total length of said first semiconductor light-emitting layer along a direction that the widths are measured.

5. The light emitting device as claimed in claim 1, wherein said die further includes a third semiconductor light-emitting layer emitting a UV light.

6. The light emitting device as claimed in claim 1, wherein said third semiconductor light-emitting layer is proximate to said p-type cladding layer, said second semiconductor light-emitting layer being proximate to said n-type cladding layer, said first semiconductor light-emitting layer being disposed between said second and third semiconductor light-emitting layers.

7. The light emitting device as claimed in claim 1, wherein the first wavelength range is from 440 nm to 480 nm.

8. The light emitting device as claimed in claim 1, wherein the second wavelength range is from 520 nm to 560 nm.

9. The light emitting device as claimed in claim 1, wherein the third wavelength range is from 575 nm to 650 nm.

10. The light emitting device as claimed in claim 5, wherein the UV light has a wavelength smaller than 440 nm.

11. The light emitting device as claimed in claim 1, wherein said photostimulable luminescent substance includes a material selected from the group consisting of $LiEuW_2O_8$, $(Y,La)_2O_3:Eu$, $(Ba,Mg,Zn)S:Eu$, $Y_2O_2S:Eu$, $Y_2O_2S:Bi$, $YVO_4:Eu$, $YVO_4:Bi$, $SrY_2S_4:Eu$, $CaLaS_4:Ce$, $(Ba,Ca,Sr)S:Eu$, $SrS:Eu$, $(Zn,Cd)S:Ag$, $(Zn,Cd)S:Cl$, $AEu_xLn_{1-x}M_2O_8$, $Y_2O_3:Eu$, $Y_2O_3:Bi$, $QP_2O_7:Eu$, $QP_2O_7:Mn$, and $3.5MgO.0.5MgF_2.GeO_2:Mn$, wherein:

$0 < x \leq 1$;

A is Li, Na, K, Rb, or Cs;

Ln is Y, La, Gd, or Lu;

P is W or Mo; and

Q is Sr, Ca, Ba, or Mg.

12. The light emitting device as claimed in claim 1, further comprising a holding member holding said die and said photostimulable luminescent substance.

13. The light emitting device as claimed in claim 12, wherein said holding member includes a light-transmissive encapsulating body to encapsulate said die, a first lead electrically connected to said die, and a second lead electrically connected to said die, said photostimulable luminescent substance being contained in said light-transmissive encapsulating body.

14. The light emitting device as claimed in claim 12, wherein said holding member includes a first lead electrically connected to said die, and a second lead electrically connected to said die and having a receiving recess, said die being received in said receiving recess, said photostimulable luminescent substance being filled in said receiving recess to encapsulate said die.

* * * * *